(12) United States Patent
Pan et al.

(10) Patent No.: US 8,295,013 B1
(45) Date of Patent: Oct. 23, 2012

(54) DISK DRIVE HEAD STACK ASSEMBLY HAVING A FLEXIBLE PRINTED CIRCUIT WITH HEAT TRANSFER LIMITING FEATURES

(75) Inventors: Tzong-Shii Pan, San Jose, CA (US); Daniel Nguyen, Milpitas, CA (US); Shujun Tang, Santa Cruz, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

(21) Appl. No.: 13/398,578

(22) Filed: Feb. 16, 2012

Related U.S. Application Data

(63) Continuation-in-part of application No. 13/164,936, filed on Jun. 21, 2011, which is a continuation-in-part of application No. 13/078,829, filed on Apr. 1, 2011, which is a continuation-in-part of application No. 12/916,237, filed on Oct. 29, 2010.

(51) Int. Cl.
 *G11B 5/127* (2006.01)
(52) U.S. Cl. .................................................. 360/245.4
(58) Field of Classification Search ............... 360/245.4, 360/234.5, 245, 245.3, 245.7, 245.9, 244.2, 360/244.5, 244.3, 234.6, 245.1, 245.6, 264.3, 360/244.9
See application file for complete search history.

(56) References Cited

U.S. PATENT DOCUMENTS

| | | | |
|---|---|---|---|
| 5,465,186 A * | 11/1995 | Bajorek et al. ................ | 360/323 |
| 5,861,661 A | 1/1999 | Tang et al. | |
| 5,903,056 A | 5/1999 | Canning et al. | |
| 6,036,813 A | 3/2000 | Schulz et al. | |
| 6,228,689 B1 | 5/2001 | Liu | |
| 6,351,352 B1 * | 2/2002 | Khan et al. ................. | 360/264.2 |
| 6,381,099 B1 | 4/2002 | Mei | |
| 6,382,499 B1 | 5/2002 | Satoh et al. | |
| 6,614,623 B2 | 9/2003 | Nakamura et al. | |
| 6,639,757 B2 | 10/2003 | Morley et al. | |
| 6,656,772 B2 | 12/2003 | Huang | |
| 6,703,566 B1 | 3/2004 | Shiraishi et al. | |
| 6,757,137 B1 | 6/2004 | Mei | |
| 6,992,862 B2 | 1/2006 | Childers et al. | |
| 7,075,701 B2 | 7/2006 | Novotny et al. | |
| 7,154,708 B2 | 12/2006 | Chhabra et al. | |
| 7,205,484 B2 | 4/2007 | Shiraishi et al. | |
| 7,245,458 B2 | 7/2007 | Zhang et al. | |
| 7,298,593 B2 | 11/2007 | Yao et al. | |

(Continued)

OTHER PUBLICATIONS

US 7,337,529, 03/2008, Bennin et al. (withdrawn).

(Continued)

*Primary Examiner* — Allen Cao

(57) ABSTRACT

A head stack assembly (HSA) for a disk drive includes an actuator body, at least one actuator arm extending from the actuator body, and a flexible printed circuit (FPC). The FPC includes first and second pluralities of electrically conductive FPC traces, each having a distal portion that terminates at a respective one of a plurality of FPC bond pads. The HSA also includes a head gimbal assembly (HGA) having a laminate flexure with a plurality of electrically conductive flexure bond pads that are bonded to the plurality of FPC bond pads. A width of at least one of the first plurality of FPC traces is greater than a width of at least one of the second plurality of FPC traces. The distal portion of at least one of the first plurality FPC traces includes a first opening therethrough, for example less than 1 mm from its corresponding FPC bond pad.

29 Claims, 10 Drawing Sheets

U.S. PATENT DOCUMENTS

| | | |
|---|---|---|
| 7,359,154 B2 | 4/2008 | Yao et al. |
| 7,372,669 B2 | 5/2008 | Deguchi et al. |
| 7,375,874 B1 | 5/2008 | Novotny et al. |
| 7,388,733 B2 | 6/2008 | Swanson et al. |
| 7,394,139 B2 | 7/2008 | Park et al. |
| 7,414,814 B1 | 8/2008 | Pan |
| 7,440,236 B1 | 10/2008 | Bennin et al. |
| 7,450,346 B2 | 11/2008 | Arya et al. |
| 7,515,240 B2 | 4/2009 | Lu et al. |
| 7,525,769 B2 | 4/2009 | Yao et al. |
| 7,652,890 B2 | 1/2010 | Ohsawa et al. |
| 7,697,102 B2 | 4/2010 | Hirakata et al. |
| 7,764,467 B2 | 7/2010 | Hanya et al. |
| 7,876,664 B2 | 1/2011 | Tsukagoshi et al. |
| 8,015,692 B1 * | 9/2011 | Zhang et al. ............... 29/603.14 |
| 8,111,483 B2 | 2/2012 | Arai |
| 2001/0017749 A1 | 8/2001 | Stefansky |
| 2005/0030670 A1 | 2/2005 | Ando et al. |
| 2005/0243472 A1 | 11/2005 | Kamigama et al. |
| 2006/0098347 A1 | 5/2006 | Yao et al. |
| 2006/0146262 A1 | 7/2006 | Yu et al. |
| 2006/0157869 A1 | 7/2006 | Huang et al. |
| 2007/0246251 A1 | 10/2007 | Shiraishi et al. |
| 2008/0002303 A1 | 1/2008 | Wang et al. |
| 2008/0068757 A1 | 3/2008 | Kamigama et al. |
| 2008/0088975 A1 | 4/2008 | Bennin et al. |
| 2008/0225439 A1 | 9/2008 | Komura |
| 2009/0151994 A1 | 6/2009 | Ohsawa et al. |
| 2009/0211789 A1 | 8/2009 | Yeates et al. |
| 2009/0253233 A1 | 10/2009 | Chang et al. |
| 2010/0118444 A1 * | 5/2010 | Rothenberg et al. ....... 360/245.9 |
| 2010/0176827 A1 | 7/2010 | Yamazaki et al. |
| 2010/0188778 A1 * | 7/2010 | Castagna .................. 360/245.9 |
| 2010/0195474 A1 | 8/2010 | Tsukuda et al. |
| 2011/0317309 A1 | 12/2011 | Shum et al. |
| 2012/0067626 A1 | 3/2012 | Mizutani |

OTHER PUBLICATIONS

Notice of Allowance dated Apr. 11, 2012 from U.S. Appl. No. 13/078,829, 22 pages.

Notice of Allowance dated May 21, 2012 from U.S. Appl. No. 13/164,936, 17 pages.

Notice of Allowance dated May 29, 2012 from U.S. Appl. No. 13/164,959, 17 pages.

* cited by examiner

DISK DRIVE HEAD STACK ASSEMBLY HAVING A FLEXIBLE PRINTED CIRCUIT WITH HEAT TRANSFER LIMITING FEATURES

CROSS-REFERENCE TO RELATED APPLICATIONS

This application claims benefit as a continuation-in-part of pending U.S. patent application Ser. No. 13/164,936, filed Jun. 21, 2011, which is a continuation-in-part of pending U.S. patent application Ser. No. 13/078,829, filed Apr. 1, 2011, which is a continuation-in-part of pending U.S. patent application Ser. No. 12/916,237, filed Oct. 29, 2010.

BACKGROUND

Information storage devices are used to retrieve and/or store data in computers and other consumer electronics devices. A magnetic hard disk drive is an example of an information storage device that includes one or more heads that can both read and write, but other information storage devices also include heads—sometimes including heads that cannot write.

In a modern magnetic hard disk drive device, each head is a sub-component of a head-gimbal assembly (HGA) that typically includes a laminated flexure to carry the electrical signals to and from the head. The HGA, in turn, is a sub-component of a head-stack assembly (HSA) that typically includes a plurality of HGAs, an actuator, and a flexible printed circuit (FPC). The plurality of HGAs are attached to various arms of the actuator.

Modern laminated flexures typically include flexure conductive traces that are isolated from a flexure structural layer by a flexure dielectric layer. So that the signals from/to the head can reach the FPC on the actuator body, each HGA flexure includes a flexure tail that extends away from the head along a corresponding actuator arm and ultimately attaches to the FPC adjacent the actuator body. That is, the flexure includes flexure traces that extend from adjacent the head and continue along the flexure tail to flexure electrical connection points adjacent the FPC.

The FPC includes conductive electrical terminals that correspond to the electrical connection points of the flexure tail, and FPC conductive traces that lead from such terminals to a pre-amplifier chip. The FPC conductive traces are typically separated from an FPC stiffener by an FPC dielectric layer. The FPC may also include an FPC cover layer over the FPC conductive traces, the FPC cover layer having a window to allow electrical conduction to the pre-amplifier chip and access to the FPC terminals. The FPC conductive traces may have different widths, for example so that they can match different desired electrical impedances. To facilitate electrical connection of the flexure conductive traces to the FPC conductive electrical terminals during the HSA manufacturing process, the flexure tails must first be properly positioned relative to the FPC, so that the flexure conductive traces are aligned with the FPC conductive electrical terminals. Then the flexure tails must be held or constrained against the FPC conductive electrical terminals while the aforementioned electrical connections are made (e.g. by ultrasonic bonding, solder jet bonding, or solder bump reflow).

However, recently for some disk drive products, the aforementioned electrical connections may employ a type of anisotropic conductive film (ACF) bonding. An anisotropic conductive film is typically an adhesive doped with conductive beads or cylindrical particles of uniform or similar diameter or size. As the doped adhesive is compressed and cured, it is heated and squeezed between the surfaces to be bonded with sufficient uniform pressure that a single layer of the conductive beads makes contact with both surfaces to be bonded. In this way, the thickness of the adhesive layer between the bonded surfaces becomes approximately equal to the size of the conductive beads after those are compressed (i.e. the adhesive layer thickness is preferably less than the original undeformed size of the conductive beads). The cured adhesive film may conduct electricity via the contacting beads in a direction normal to the bonded surfaces (though may not necessarily conduct electricity parallel to the bonded surfaces, since the beads may not touch each other laterally—though axially each bead is forced to contact both of the surfaces to be bonded—hence the term "anisotropic").

Maintaining sufficiently uniform temperature and pressure during adhesive curing, such that a single layer of conductive beads in an ACF makes contact with both opposing surfaces to be bonded and curing is acceptably uniform, may be achievable for existing HGA designs using a tool that presses only upon a single bond pad. However, in a high-volume manufacturing environment like that necessitated by the very competitive information storage device industry, there is a practical requirement for fast, cost-effective, and robust bonding of many bond pads simultaneously; bonding one bond pad at a time simply takes too much time.

Accordingly, there is a need in the art for an improved FPC design that may facilitate a more uniform bonding temperature to groups of bond pads, to more quickly accomplish reliable electrical connection of the flexure conductive traces to FPC conductive electrical terminals (e.g. by ACF or by any other bonding method that benefits from a more uniform temperature) during HSA manufacture.

DESCRIPTION OF THE PREFERRED EMBODIMENTS

Figure 1:
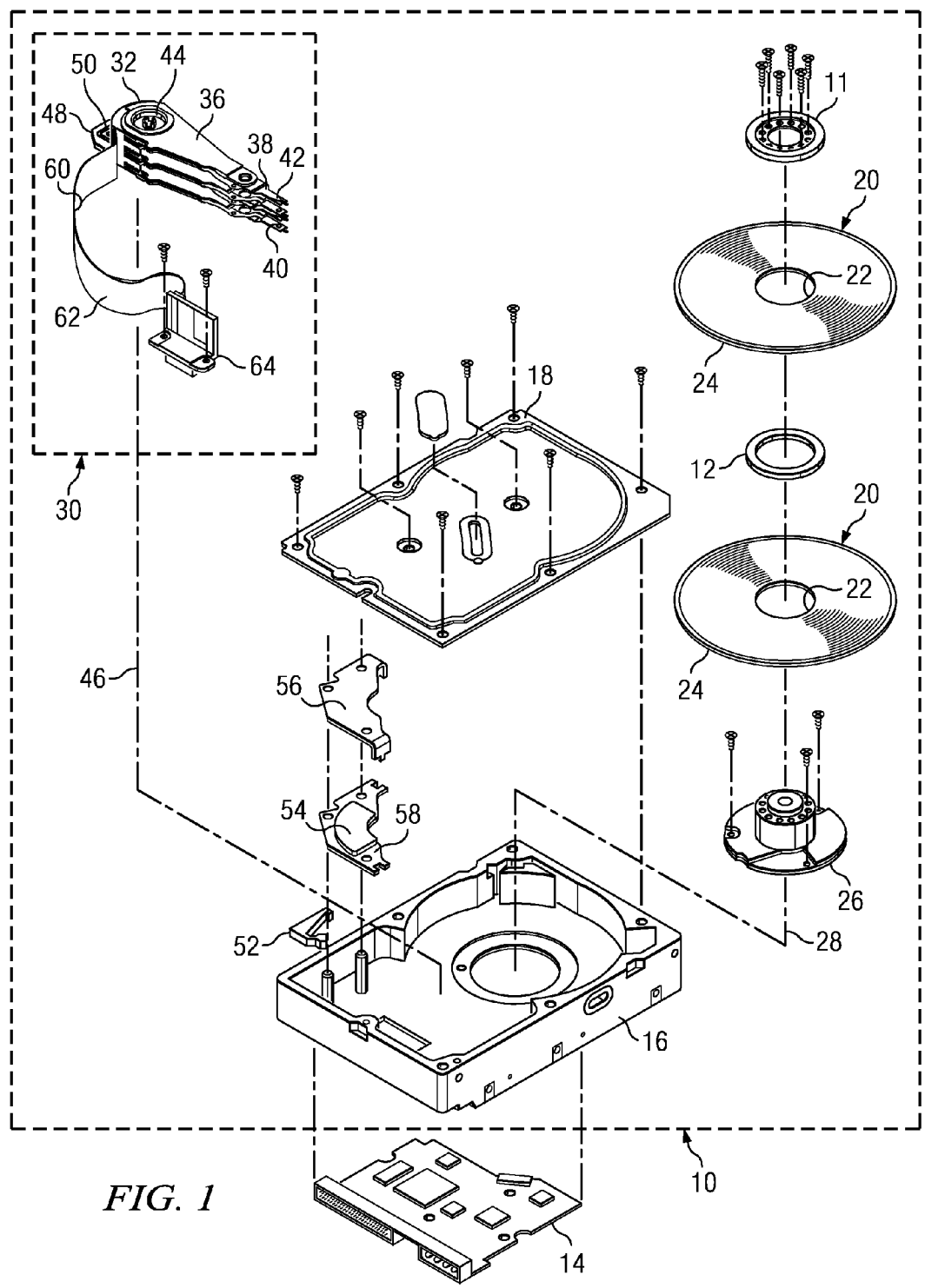
FIG. 1 is an exploded perspective view of a disk drive according to an embodiment of the present invention.

FIG. 1 is an exploded perspective view of a disk drive according to an example embodiment of the present invention. The disk drive includes a head disk assembly (HDA) 10 and a printed circuit board assembly (PCBA) 14. The HDA 10 includes a base 16 and cover 18 that together house at least one annular magnetic disk 20. Each disk 20 contains a plurality of magnetic tracks for storing data. The tracks are disposed upon opposing first and second disk surfaces of the disk 20 that extend between an inner disk edge 22 (corresponding to the inner diameter) and an outer disk edge 24 (corresponding to the outer diameter) of the disk 20. The head disk assembly 10 further includes a spindle motor 26 for rotating the disk 20 about a disk axis of rotation 28. The spindle motor 26 includes a spindle motor hub that is rotatably attached to the base 16 of the HDA 10. Disks 20 may be stacked and separated with one or more annular disk spacers 12 that are disposed about the hub, all held fixed to the hub by disk clamp 11.

The HDA 10 further includes a head stack assembly (HSA) 30 rotatably attached to the base 16 of HDA 10. The HSA 30 includes an actuator comprising an actuator body 32 and one or more actuator arms 36 extending from the actuator body 32. The actuator body 32 includes a bore 44 and a pivot bearing cartridge engaged within the bore for facilitating the HSA 30 to rotate relative to HDA 10 about actuator pivot axis 46. One or two head gimbal assemblies (HGA) 38 are attached to a distal end of each actuator arm 36. Each HGA includes a head (e.g. head 40) for reading and writing data from and to the disk 20, and a load beam 42 to compliantly preload the head against the disk 20. The HSA 30 further includes a coil support 48 that extends from one side of the HSA 30 that is opposite head 40. The coil support 48 is configured to support a coil 50 through which a controlled electrical current is passed. The coil 50 interacts with one or more magnets 54 that are attached to base 16 via a yoke structure 56, 58 to form a voice coil motor for controllably rotating the HSA 30. HDA 10 includes a latch 52 rotatably mounted on base 16 to prevent undesired rotations of HSA 30.

The PCBA 14 includes a servo control system for generating servo control signals to control the current through the coil 50 and thereby position the HSA 30 relative to tracks disposed upon surfaces of disk 20. The HSA 30 is electrically connected to PCBA 14 via a flexible printed circuit (FPC) 60, which includes a flex cable 62 and a flex cable support bracket 64. The flex cable 62 supplies current to the coil 50 and carries signals between the HSA 30 and the PCBA 14.

In the magnetic hard disk drive of FIG. 1, the head 40 includes a body called a "slider" that carries a magnetic transducer on its trailing end (not visible given the scale of FIG. 1). The magnetic transducer may include an inductive write element and a magnetoresistive read element. During operation the transducer is separated from the magnetic disk by a very thin hydrodynamic air bearing. As the motor 26 rotates the magnetic disk 20, the hydrodynamic air bearing is formed between an air bearing surface of the slider of head 40, and a surface of the magnetic disk 20. The thickness of the air bearing at the location of the transducer is commonly referred to as "flying height."

Figure 2:
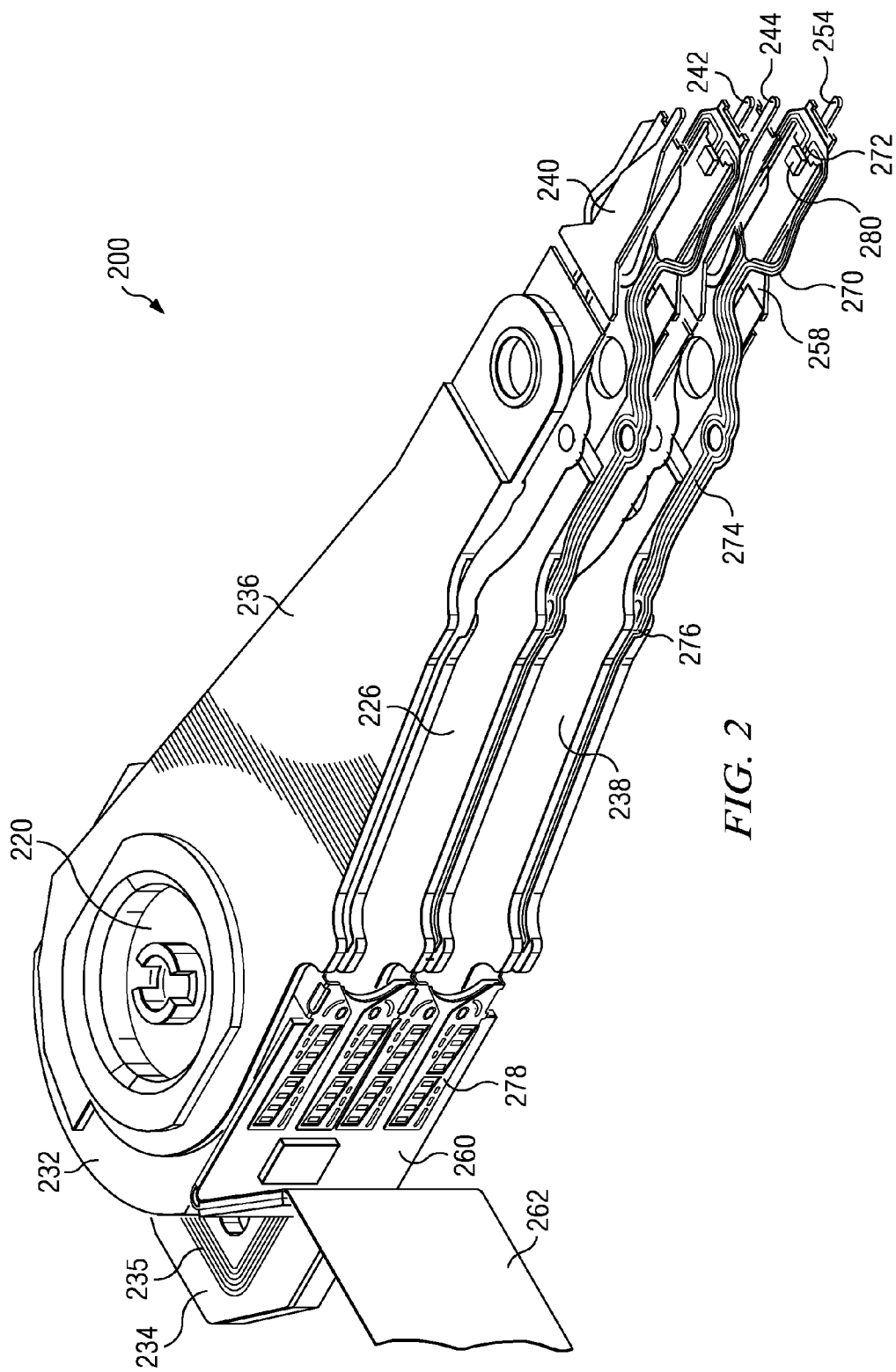
FIG. 2 is a perspective view of a head stack assembly (HSA) according to an embodiment of the present invention.

FIG. 2 is a perspective view of a head stack assembly (HSA) 200 according to an example embodiment of the present invention. The HSA 200 includes an actuator body 232 and a plurality of actuator arms 226, 236, 238 extending from the actuator body 232. The actuator body 232 may comprise aluminum, for example. The actuator body 232 may include a pivot bearing cartridge 220 disposed in the actuator bore, and a coil support 234 that supports a coil 235 and extends from the actuator body 232 in a direction that is generally opposite the actuator arms 226, 236, 238.

In the embodiment of FIG. 2, the HSA 200 also includes a plurality of head gimbal assemblies (HGA) 240, 242, 244, 254, attached to the actuator arms 226, 236, 238. For example, such attachment may be made by swaging. Note that the inner actuator arm 226 includes two HGAs, while each of the outer actuator arms 236, 238, includes only one HGA. This is because in a fully populated disk drive the inner arms are positioned between disk surfaces while the outer actuator arms are positioned over (or under) a single disk surface. In a depopulated disk drive, however, any of the actuator arms may have one or zero HGAs, possibly replaced by a balance weight.

Each HGA includes a head for reading and/or writing to an adjacent disk surface (e.g. HGA 254 includes head 280). The head 280 is attached to a tongue portion 272 of a laminated flexure 270. The laminated flexure 270 is part of the HGA 254, and is attached to a load beam 258 (another part of the HGA 254). The laminated flexure 270 may include a structural layer (e.g. stainless steel), a dielectric layer (e.g. polymide), and a conductive layer into which traces are patterned (e.g. copper). The HSA 200 also includes a flexible printed circuit (FPC) 260 adjacent the actuator body 232, and the FPC 260 includes a flex cable 262. The FPC 260 may comprise a laminate that includes two or more conventional dielectric and conductive layer materials (e.g. one or more polymeric materials, copper, etc). The laminated flexure 270 includes a flexure tail 274 that includes an intermediate region 276 that is disposed adjacent the actuator arm 238, and a terminal region 278 that is electrically connected to bond pads of the FPC 260.

Methods of electrical connection of the flexure tails to the FPC 260 include ultrasonic bonding of gold coatings thereon, solder reflow, solder ball jet (SBJ), and anisotropic conductive film (ACF) bonding, and are preferably but not necessarily automated. To electrically connect and securely attach the flexure tails to the FPC 260, the flexure tails are first aligned with the FPC 260, and then pressed against the FPC 260 (at least temporarily) while electrical connection is established and secure attachment is completed. Maintaining sufficient uniform pressure and temperature to groups of bond pads may be desirable during this process. Uniformity of temperature among bond pads may be enhanced by certain inventive structural features of the FPC 260, described by way of detailed examples herein.

Figure 3A:
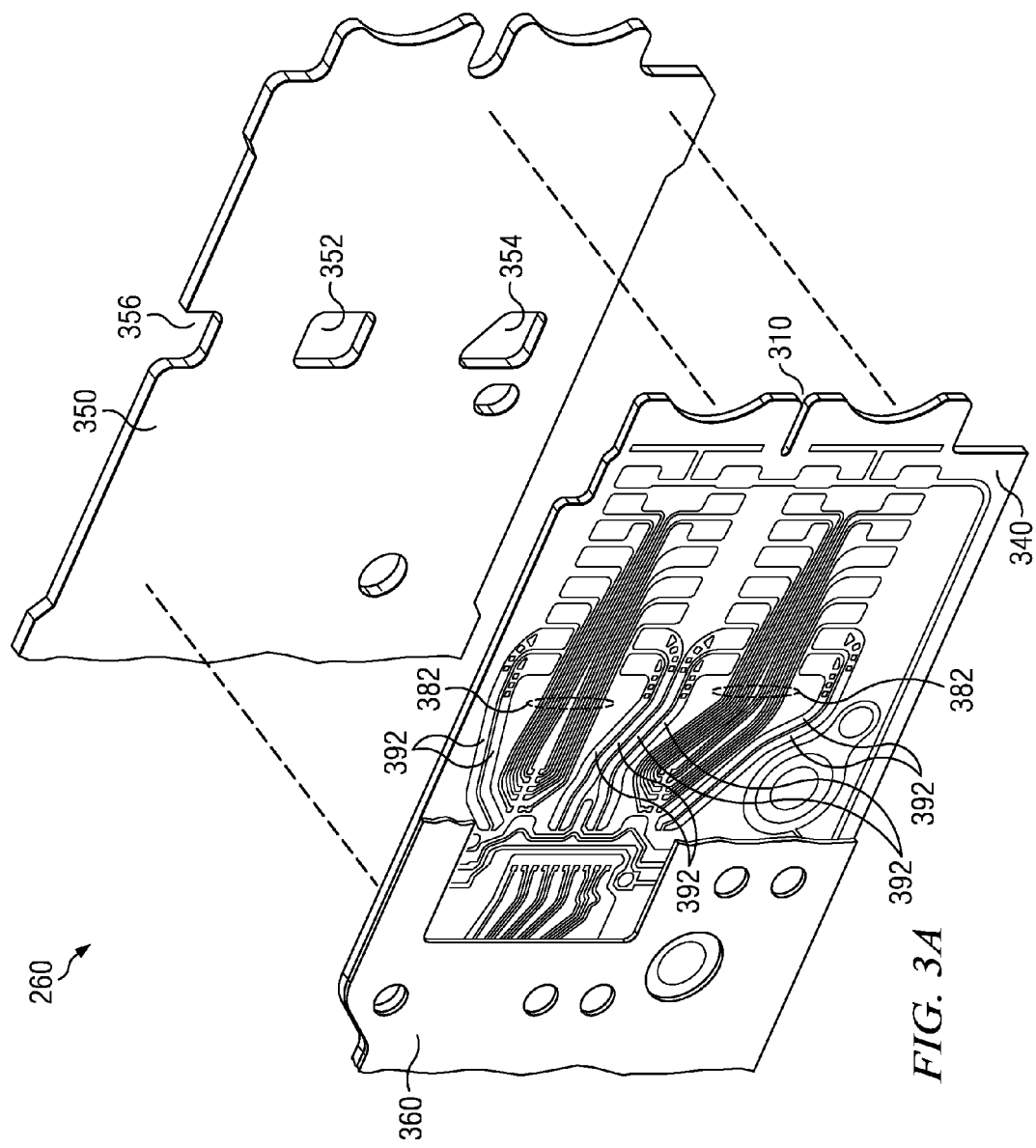
FIG. 3A is a perspective view of a portion of a flexible printed circuit (FPC) according to an embodiment of the present invention, shown with a FPC cover layer partially cut-away to better depict underlying FPC conductive traces, and shown with a FPC stiffener exploded away to better depict openings therethrough.
Figure 3B:
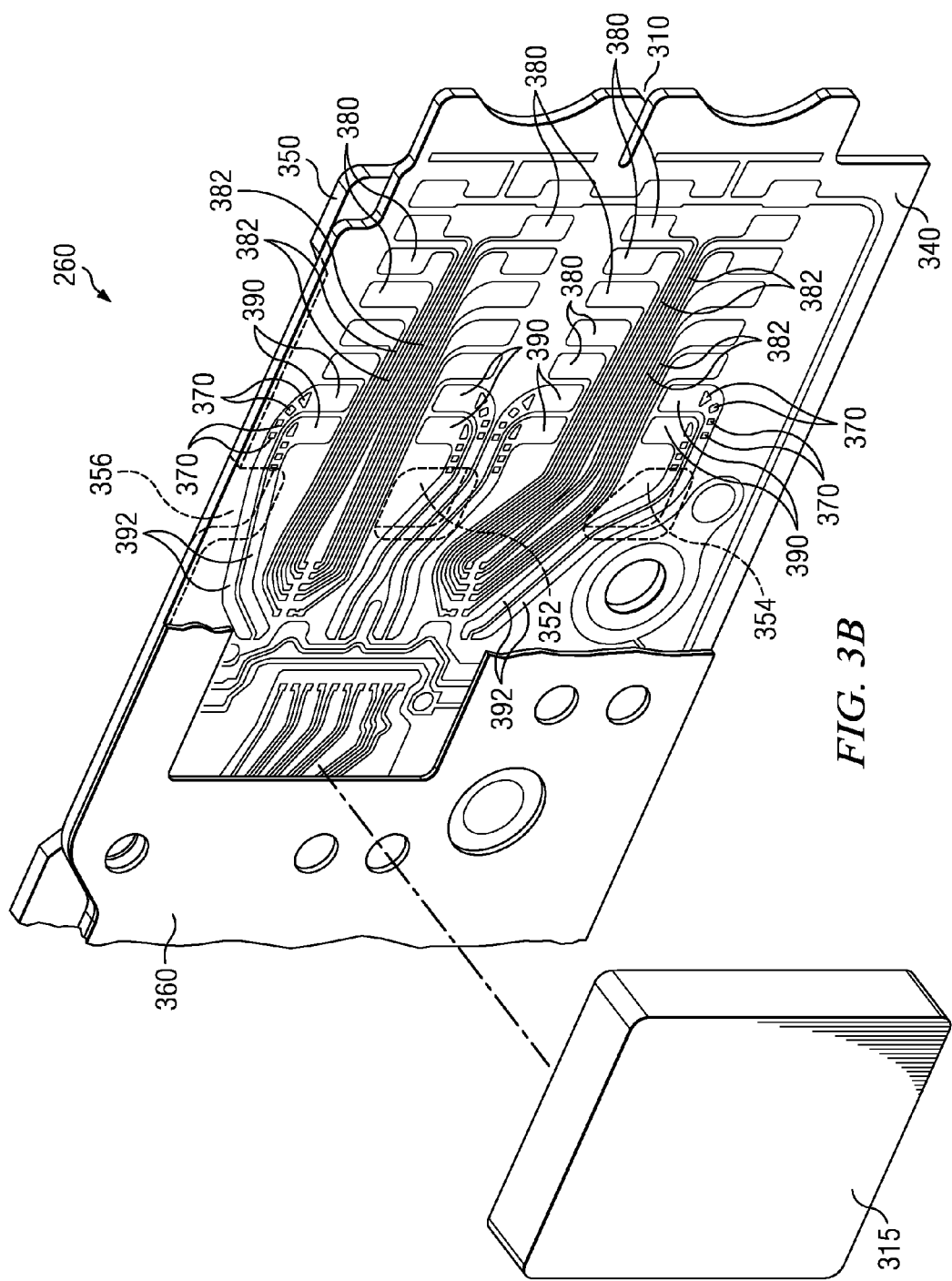
FIG. 3B is a perspective view of the FPC of FIG. 3A, shown with the FPC cover layer partially cut-away (and with a pre-amplifier chip exploded away) to better depict underlying FPC conductive traces, and with the FPC stiffner in the assembled position.
Figure 3C:
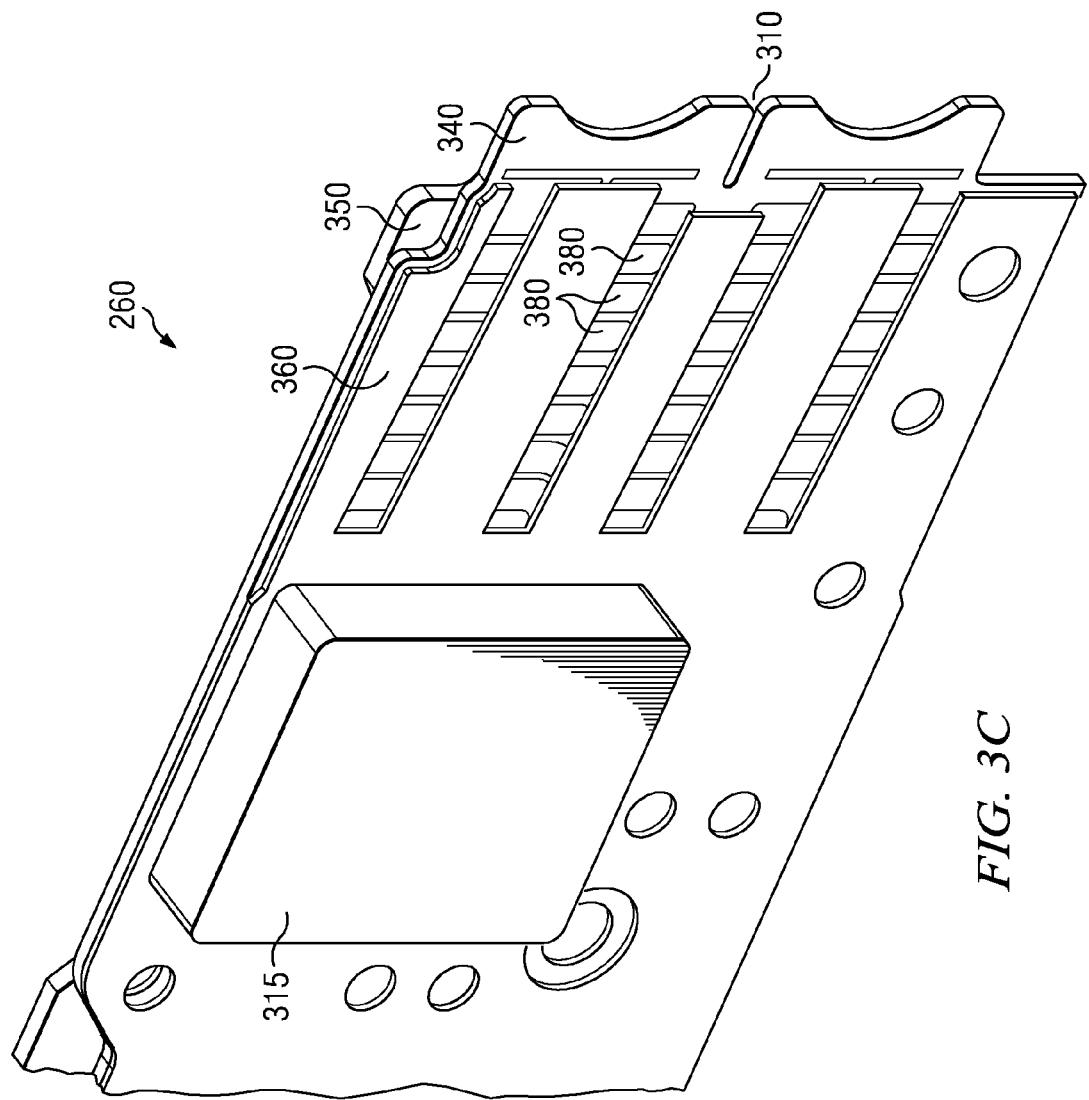
FIG. 3C is an assembled perspective view of the FPC portion of FIGS. 3A and 3B.

FIG. 3A is a perspective view of a portion of a flexible printed circuit (FPC) 260 according to an embodiment of the present invention, before flexure tail terminal regions (e.g. the flexure tail terminal region 278 shown in FIG. 2) are bonded thereto. In FIG. 3A, a FPC stiffener 350 is shown exploded away from the rest of the FPC 260. FIG. 3B is a perspective view of the FPC of FIG. 3A, shown with a pre-amplifier chip 315 exploded away from the rest of the FPC 260. FIG. 3C is an assembled perspective view of the FPC 260 of FIGS. 3A and 3B.

In the embodiment of FIGS. 3A and 3B, the FPC 260 includes electrically conductive FPC traces 382, 392, each having a distal portion that terminates at a respective one of a plurality of electrically conductive FPC bond pads 380, 390. The electrically conductive FPC traces 382, 392 may comprise copper for example, and the FPC bond pads 380, 390 may comprise copper with a gold coating, for example. The electrically conductive FPC bond pads 380, 390 are intended to be aligned with and connected to flexure bond pads of the terminal regions of HGA flexure tails (e.g. flexure tail terminal region 278 shown in FIG. 2). The electrically conductive FPC traces 382, 392 may connect to a pre-amplifier chip 315 (shown exploded from the FPC 260 in FIG. 3B). Intermediate regions of two of the HGA flexure tails (e.g. flexure tail intermediate region 276 shown in FIG. 2) may pass through the FPC slit 310 to help facilitate their support and alignment.

In the embodiment of FIGS. 3A-C, the FPC 260 includes an optional insulative FPC cover layer 360 over the FPC traces 382, 392 and having windows exposing the regions where the flexure tail terminal regions and the pre-amplifier chip 315 are bonded thereto. In FIGS. 3A and 3B, the FPC 260 is shown with the FPC cover layer 360 partially cut-away to better depict underlying FPC conductive traces 382, 392.

In the embodiment of FIGS. 3A and 3B, the electrically conductive FPC traces 392 are wider than the electrically conductive FPC traces 382, for example so that they can match a lower desired electrical impedance. For example, in certain embodiments, those FPC traces that connect through to an inductive write element of a read/write head may be wider than those that connect through to a magnetoresistive read element (e.g. a tunneling magneto-resistive read element) of the read/write head. For example, a desired writer transmission line impedance might be approximately 50Ω with a write frequency of approximately 2.7 GHz, though write frequencies may trend higher in the future and desired impedances may trend lower in the future, for example to reduce power consumption.

During bonding of the FPC bond pads 380, 390 to flexure bond pads of the flexure tail terminal regions, those FPC bond pads 390 associated with the wider FPC traces 392 may conduct away more heat than the FPC bond pads 380 associated with narrower FPC traces 382. Therefore, to maintain more uniform temperature among the various bond pads during bonding, it may be advantageous to reduce the rate of heat transfer from the FPC bond pads 390 relative to that from the FPC bond pads 380.

It may also be advantageous to enhance the speed and ease of the manufacturing process by simultaneously bonding all of the FPC bond pads 380, 390 with a relatively large and simple tool that cannot control the temperature applied to one bond pad independently from the temperature applied to another bond pad. Hence, it may be desirable to vary the rate of heat conduction away from specific FPC bond pads (relative to other FPC bond pads) via design of certain structural aspects of the FPC.

For example, in the embodiment of FIGS. 3A and 3B, the distal portions of the wider FPC traces 392 include openings 370 therethrough (in this embodiment, four openings 370 per FPC trace 392, and in general preferably 1 to 20 openings through the distal portion of each FPC trace 392). The openings 370 in the distal portion of each of the wider FPC traces 392 may serve to reduce the rate of heat conduction through the wider FPC traces 392 away from the FPC bond pads 390, so that such rate of heat conduction may be less different from the rate of heat conduction through the narrower FPC traces 382 away from the FPC bond pads 380. Otherwise, the rate of heat conduction through the narrower FPC traces 382 away from the FPC bond pads 380 may be substantially lower than that through the wider FPC traces 392 away from the FPC bond pads 390. Hence, the openings 370 in the distal portion of each of the wider FPC traces 392 may advantageously improve the temperature uniformity among the FPC bond pads 380 and 390, temporarily during the bonding process (i.e. bonding flexure tails to the FPC during head stack assembly).

In the embodiment of FIGS. 3A and 3B, each of the openings 370 preferably spans at least 30% of the width of the corresponding FPC trace 392 in its distal portion. For example, the width of the distal portion of the FPC trace 392 may be in the range 100 microns to 300 microns, with each of the openings 370 spanning at least 30 microns, but no more than 260 microns of the width of the distal portion of the FPC trace 392. In certain embodiments, such inequalities may help to advantageously improve the temperature uniformity among the FPC bond pads 380 and 390, temporarily during the bonding process (i.e. bonding flexure tails to the FPC during head stack assembly).

In certain embodiments, the closest of the openings 370 to the FPC bond pad 390 is the most important of the openings 370 from a functional perspective. Hence, in certain embodiments, there need be only one opening 370 in the distal portion of each of the FPC traces 392, rather than four as shown in FIGS. 3A and 3B. In certain embodiments, such single opening 370 may be disposed immediately adjacent the FPC bond pad 390. In certain embodiments, such single opening 370 may be disposed at approximately the same location as the closest of the openings 370 to the FPC bond pad 390 shown in FIGS. 3A and 3B.

In certain embodiments, the closest of the openings 370 to the FPC bond pad 390 is spaced from the FPC bond pad 390 by a distance measured along the FPC trace 392 that preferably does not exceed five times the width of the distal portion of the FPC trace 392. For example, the closest of the openings 370 to the FPC bond pad 390 may be spaced from the FPC bond pad 390 by a distance measured along the FPC trace 392 that is preferably less than 1 mm. In certain embodiments, such inequalities may help to advantageously improve the temperature uniformity among the FPC bond pads 380 and 390, temporarily during the bonding process (i.e. bonding flexure tails to the FPC during head stack assembly).

In FIG. 3A, the FPC stiffener 350 is shown exploded away to better depict windows 352, 354 therethrough, and a notch 356 therethrough. The FPC stiffener 350 may be metallic, for example, the FPC stiffener 350 may comprise aluminum. The FPC stiffener 350 may be disposed in contact with the actuator body after assembly (e.g. in contact with the actuator body 232 that is shown in FIG. 2). Now referring again to FIGS. 3A-C, the FPC 260 may include a FPC dielectric layer 340 that is disposed between the FPC stiffener 350 and the FPC traces 382, 392, for example to prevent the FPC stiffener 350 from creating an electrical short between the FPC traces 382, 392 if the FPC stiffener 350 comprises a conductive metal. Note that the FPC dielectric layer 340 is not the same layer as the insulative FPC cover layer 360, at least because the insulative FPC cover layer 360 is disposed over the FPC traces 382, 392 rather than between the FPC stiffener 350 and the FPC traces 382, 392.

In the embodiment of FIGS. 3A-C, the windows 352, 354 through the FPC stiffener 350 are positioned so that each overlies a portion of the FPC traces 392, but does not overlie any portion of the FPC traces 382. Likewise, the notch 356 through the FPC stiffener 350 is positioned so that it overlies a portion of the FPC traces 392, but does not overlie any portion of the FPC traces 382. Because the FPC stiffener 350 may act as a heat sink that may increase the heat dissipation from adjacent FPC traces, in certain embodiments the aforedescribed location of the windows 352, and 354, and of the notch 356, may help to advantageously improve the temperature uniformity among the FPC bond pads 380 and 390, temporarily during the bonding process (i.e. bonding flexure tails to the FPC during head stack assembly). For example, the window 354 may help increase the temperature of corresponding FPC bond pads 390 by reducing heat dissipation via adjacent FPC traces 392, but does not substantially increase the temperature of FPC bond pads 380 (since the window 354 does not significantly interfere with heat dissipation via FPC traces 382 into the FPC stiffener 350).

Figure 4:
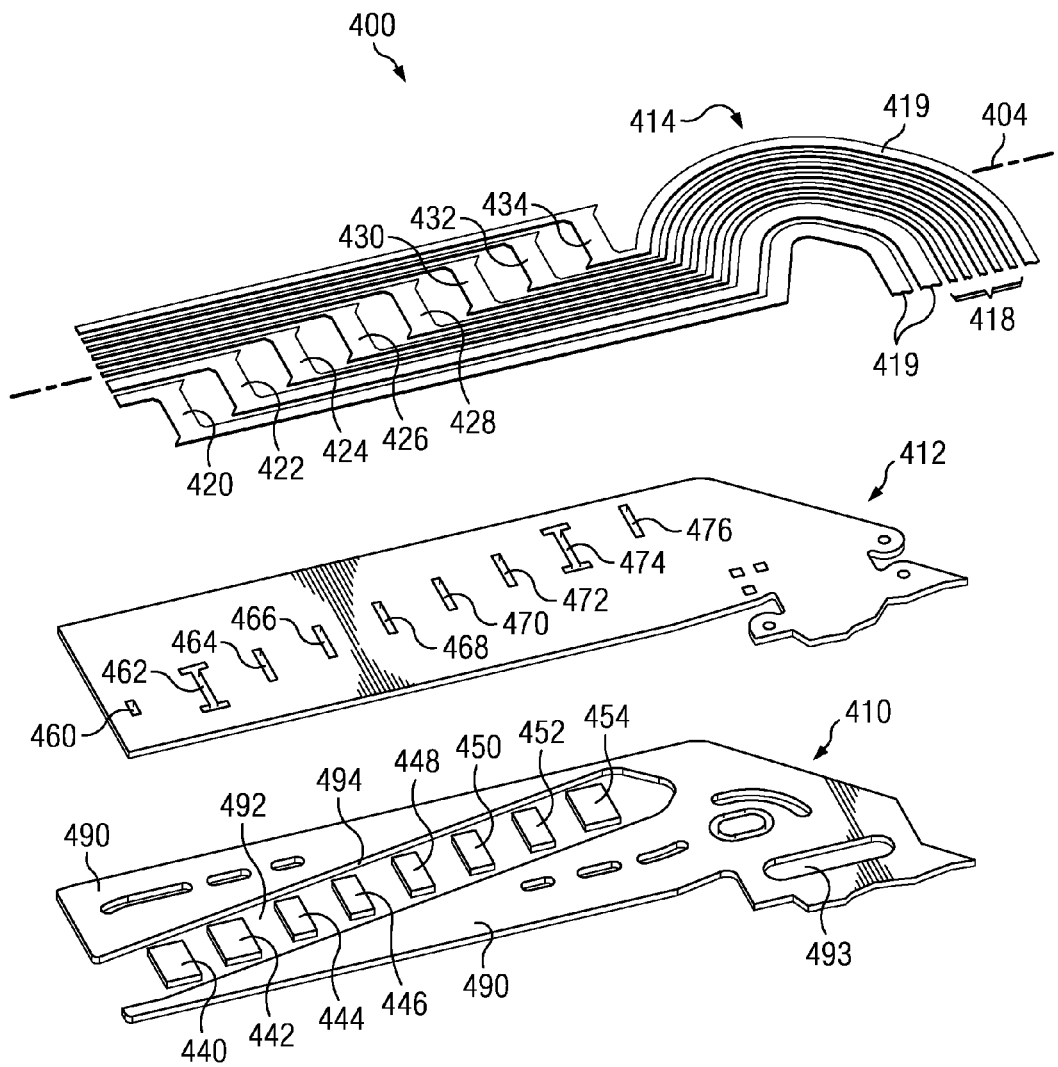
FIG. 4 is an exploded perspective view of a flexure tail terminal region, according to an embodiment of the present invention.

FIG. 4 is an exploded perspective view of a terminal region of a flexure tail 400, according to an embodiment of the present invention. The flexure tail 400 of the laminate flexure comprises a flexure structural layer 410, a flexure dielectric layer 412, and a flexure conductive layer 414. In certain embodiments, the flexure structural layer 410 comprises stainless steel, the flexure dielectric layer 412 comprises polyimide, and the flexure conductive layer 414 comprises copper, for example, though it is contemplated that other materials providing similar function might be used instead.

In the embodiment of FIG. 4, the flexure conductive layer 414 of the flexure tail 400 includes five flexure traces 418 and three flexure traces 419. Each of the flexure traces 418 includes a corresponding one of a plurality of widened regions 424, 426, 428, 430, 432, to be bonded to the FPC (e.g. FPC 260 shown in FIG. 3C). In this context, "widened" means wider than the width of a flexure trace 418 in an intermediate region where the flexure tail 400 runs along the arm (i.e. the width of a flexure trace 418 at the right side of FIG. 4). Likewise, each of the flexure traces 419 includes a corresponding one of a plurality of widened regions 420, 422, 434, to be bonded to the FPC (e.g. FPC 260 shown in FIG. 3). In this context, "widened" means wider than the width of a flexure trace 419 in the intermediate region where the flexure tail 400 runs along the arm (i.e. the width of a flexure trace 419 at the right side of FIG. 4).

Note that in the embodiment of FIG. 4, the flexure traces 419 are wider in the intermediate region than the flexure traces 418. For example, in certain embodiments, those flexure traces 419 that connect through to an inductive write element of a read/write head may be wider than those flexure traces 418 that connect through to a magnetoresistive read element of the read/write head. However, others of the flexure traces 418 and/or others of the flexure traces 419 may connect to other subcomponents of the read/write head or HGA (e.g. microactuator, transducer heater, electronic lapping guide, etc), instead of to only an inductive writer or magneto-resistive read element.

For example, in the embodiment of FIG. 4, each of the flexure traces 419 may define a first trace width in the range 80 microns to 230 microns, and each of the flexure traces 418 may define a second trace width in the range 20 microns to 50 microns. Alternatively, if more than one flexure trace 418, 419 is attached to a single widened region 420, 422, 424, 426, 428, 430, 432, or 434, then the first trace width may be considered as the sum of the widths of the attached flexure traces, and may be in the range 80 microns to 230 microns. Each of the plurality of widened regions 420, 422, 424, 426, 428, 430, 432, 434 may be preferably aligned with a corresponding one of the plurality of FPC bond pads 380, 390 shown in FIGS. 3A and 3B.

As shown in FIG. 4, each of the widened regions 420, 422, 424, 426, 428, 430, 432, 434 may extend further transverse to the flexure tail longitudinal axis 404 than it extends parallel to the flexure tail longitudinal axis 404. In certain embodiments, such inequality may render the widened regions to be relatively less sensitive to transverse misalignment with the corresponding FPC bond pad 380 of FIGS. 3A and 3B. Such transverse misalignment during disk drive assembly may be caused by FPC position variability (e.g. due to alignment pin to hole clearance), and/or undesired movement of the flexure tail by a manufacturing employee. Note that, during disk drive assembly, a manufacturing employee may more easily misalign the terminal region of the flexure tail 400 transverse to the flexure tail longitudinal axis 404 than parallel to the flexure tail longitudinal axis 404, since the flexure is difficult to stretch, and so moves more easily in the transverse direction. In this context "parallel" does not imply perfectly parallel, but rather approximately parallel (e.g. ±10 degrees from perfectly parallel). Likewise, "transverse" does not imply perfectly perpendicular, but rather approximately perpendicular (e.g. ±10 degrees from perfectly perpendicular).

Also in the embodiment of FIG. 4, a plurality of discontinuous islands 440, 442, 444, 446, 448, 450, 452, 454 are defined in the structural layer 410 and are disposed in general alignment with corresponding widened regions in the flexure conductive layer 414. For example, discontinuous island 440 is disposed in general alignment with widened region 420. In this context, an island in the structural layer 410 is considered to be discontinuous if it does not directly contact the rest of the flexure structural layer 410, even if it is joined by a web or bridge in the flexure dielectric layer 412 and/or the flexure conductive layer 414. In the embodiment of FIG. 4, each widened region 420, 422, 424, 426, 428, 430, 432, 434, along with the corresponding discontinuous island 440, 442, 444, 446, 448, 450, 452, 454 with which it is aligned, defines a flexure bond pad or flexure bond pad location.

In the embodiment of FIG. 4, the flexure structural layer 410 includes a peripheral frame 490 that defines and surrounds a structural layer window 492. As shown in FIG. 4, the discontinuous islands 440, 442, 444, 446, 448, 450, 452, 454 are disposed within the structural layer window 492. The peripheral frame 490 underlies a region of the plurality of flexure traces 418 where the flexure traces are relatively narrow. Although the structural layer window 492 has a broken and open inner contour 494 in the embodiment of FIG. 4, it may be a closed and continuous inner contour in certain alternative embodiments.

In the embodiment of FIG. 4, the discontinuous islands in the flexure structural layer 410 preferably increase the thickness of the flexure tail terminal region 400 at the locations of the flexure bond pads (e.g. at the location of the widened region 424). For example, the thickness of the flexure structural layer 410 may be preferably less than 20 microns, the thickness of the flexure dielectric layer 412 may be preferably less than 15 microns, the thickness of the flexure conductive layer 414 may be preferably less than 15 microns, while a total thickness of the flexure tail terminal region 400 at the flexure bond pads is preferably at least 25 microns. Such inequalities may enhance the utility of a non-patterned thermode tool to apply more uniform heat and pressure to the flexure bond pads during bonding.

In the embodiment of FIG. 4, each of the widened regions 420, 422, 424, 426, 428, 430, 432, 434 defines a widened region width that is measured parallel to the flexure tail longitudinal axis 404. For example, the widened region width may be in the range 90 to 230 microns. Likewise, each of the plurality of discontinuous islands 440, 442, 444, 446, 448, 450, 452, 454 defines an island width that is measured parallel to the flexure tail longitudinal axis 404. Specifically, in the embodiment of FIG. 4, the plurality of discontinuous islands 440, 442, 444, 446, 448, 450, 452, 454 includes five discontinuous islands 444, 446, 448, 450, and 452, each having an island width that is not greater than the widened region width of widened regions 424, 426, 428, 430, 432, respectively. By contrast, however, the plurality of discontinuous islands 440, 442, 444, 446, 448, 450, 452, 454 also includes three discontinuous islands 440, 442, 454, each having an island width that is in the range 1.1 to 2 times the widened region width of widened regions 420, 422, and 434, respectively.

Hence, in the embodiment of FIG. 4, the island widths of the three discontinuous islands 440, 442, 454, are each greater than the island widths of the five discontinuous islands 444, 446, 448, 450, and 452. The foregoing inequalities may enable the terminal region of the flexure tail 400 to desirably allow a greater amount of heat to pass through the three discontinuous islands 440, 442, 454 (for bonding of the widened regions 420, 422, and 434), than through the five discontinuous islands 444, 446, 448, 450, and 452 (for bonding of the widened regions 424, 426, 428, 430, 432). The relatively greater heat flow through the discontinuous islands 440, 442, 454 may help maintain a more uniform temperature among the plurality of widened regions 420, 422, 424, 426, 428, 430, 432, 434 during bonding, because each of the three wider flexure traces 419 may conduct away more applied heat during bonding than each of the five narrower flexure traces 418.

In the embodiment of FIG. 4, the flexure dielectric layer 412 electrically insulates the conductive flexure traces 418 and 419 of the flexure conductive layer 414 from the flexure structural layer 410. Such electrical insulation may be desired because the flexure structural layer 410 may be electrically conductive (e.g. stainless steel), and so otherwise the flexure structural layer 410 may cause an electrical short between the flexure traces 418 and 419 and/or from the flexure traces 418 and 419 to ground. In the embodiment of FIG. 4, the flexure dielectric layer 412 optionally includes a plurality of through openings 460, 462, 464, 466, 468, 470, 472, 474, 476. Each of the plurality of the openings 460, 462, 464, 466, 468, 470, 472, 474, 476 through the flexure dielectric layer 412 may be disposed adjacent, but preferably not overlying, at least one of the plurality of discontinuous islands 440, 442, 444, 446, 448, 450, 452, 454 in the flexure structural layer 410. In certain embodiments, the openings 460, 462, 464, 466, 468, 470, 472, 474, 476 through the flexure dielectric layer 412 may serve an adhesive control purpose (e.g. to limit the spread of adhesive used during the flexure tail bonding process).

Figure 5:
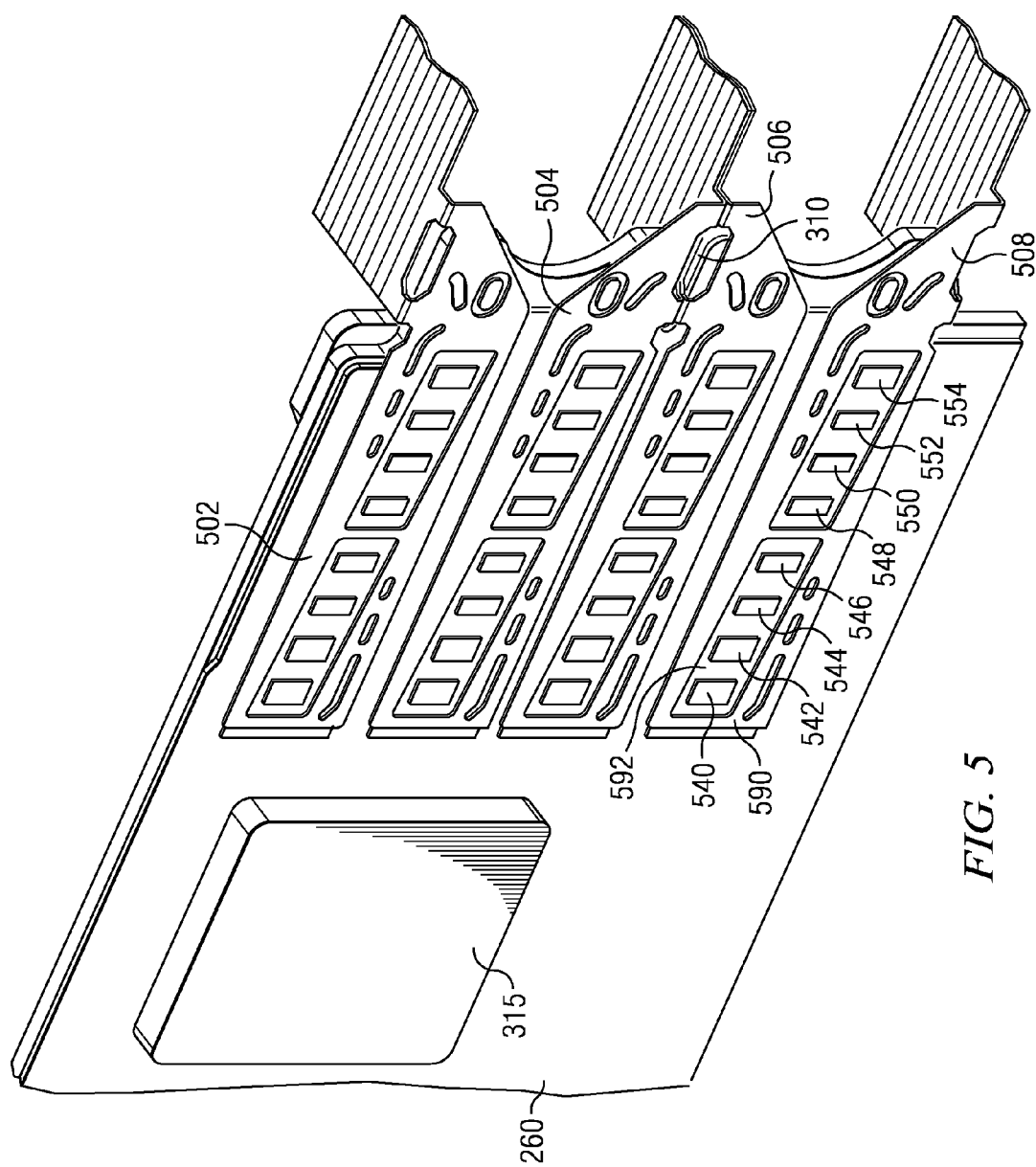
FIG. 5 is a perspective view of a plurality of flexure tail terminal regions attached to the FPC of FIG. 3C, according to an embodiment of the present invention.

FIG. 5 is a perspective view of the terminal regions of a plurality of flexure tails 502, 504, 506, 508 attached to the FPC 260 of FIG. 3C, according to an embodiment of the present invention. An intermediate region of the flexure tails 504 and 506 may extend into the slit 310 of the FPC 260. Note that in the example embodiment of FIG. 5, each of the flexure tails 502, 504, 506, 508 is bent so that each of the flexure tail terminal regions is substantially orthogonal to the intermediate region of the same flexure tail. Such bending may be facilitated by an optional opening (e.g. opening 493 shown in FIG. 4, that locally weakens the structural layer 410).

Now referring again to FIG. 5, the widened regions of the flexure traces of the conductive layer of the flexure tails 502, 504, 506, 508 are not visible in the terminal regions because they are disposed on the side of the flexure tail terminal regions that is facing away from the viewer (and towards the FPC bond pads to which they are bonded). Rather, discontinuous islands 540, 542, 544, 546, 548, 550, 552, and 554 in the structural layer of the flexure tail 508 are visible in FIG. 5, because they are facing the viewer.

Note that in the embodiment of FIG. 5 the discontinuous islands do not all have the same island width. For example, the island width of each of the discontinuous islands 540, 542, and 554 of the flexure tail 508, is greater than the island width of each of the discontinuous islands 544, 546, 548, 550, 552 of the flexure tail 508. The structural layer in the terminal region of flexure tail 508 includes a peripheral frame 590 that defines and surrounds a structural layer window 592. As shown in FIG. 5, the discontinuous islands 540, 542, 544, and 546 are disposed within the structural layer window 592. The FPC 260 is shown in FIG. 5 to include pre-amplifier chip 315.

Figure 6A:
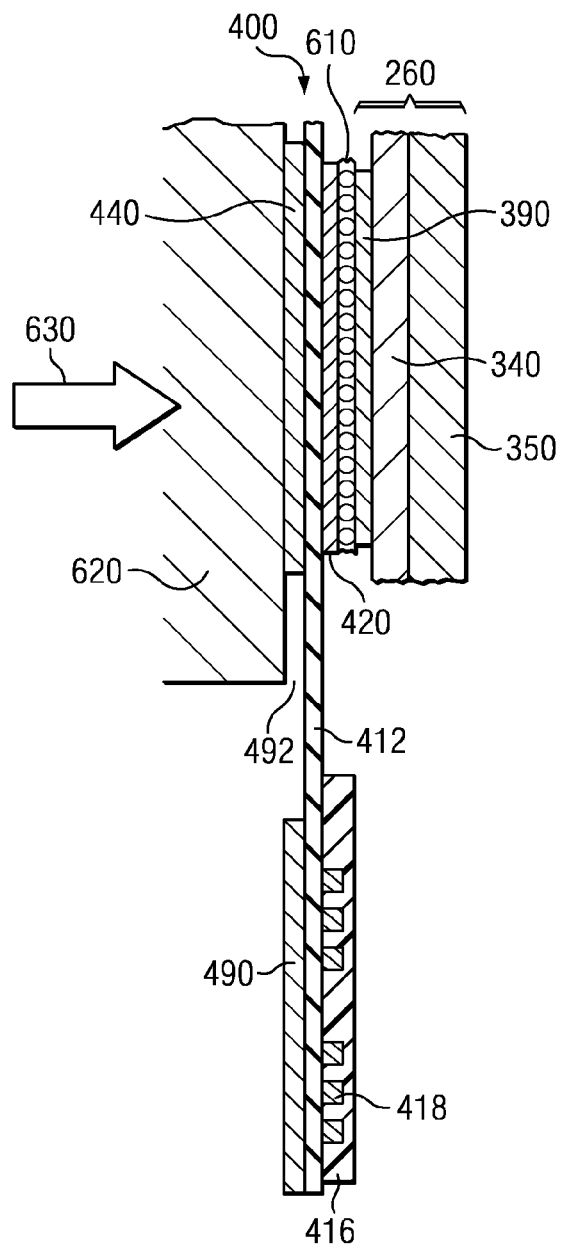
FIG. 6A depicts the bonding of a flexure bond pad to a corresponding flexible printed circuit bond pad by an anisotropic conductive film, according to an embodiment of the present invention.
Figure 6B:
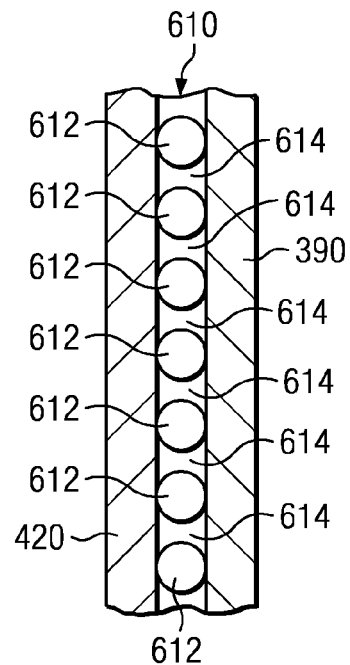
FIG. 6B is an expanded view of a portion of FIG. 6A.

In certain embodiments, and now referring to FIGS. 2-5, each of the flexure bond pads may be bonded to a corresponding one of the plurality of FPC bond pads 380, 390 by an anisotropic conductive film (ACF). For example, FIGS. 6A-B depict the bonding of a widened region 420 to a corresponding FPC bond pad 390 by an ACF 610. Note: Although all new numerical labels that appear for the first time in FIGS. 6A-B are described with reference to FIGS. 6A-B, for conciseness certain previously described numerical labels are not re-described with reference to FIGS. 6A-B, but rather are used consistently with their earlier description with reference to previous figures. For example, flexure traces 418 are shown to be electrically separated by a flexure dielectric layer 412, from a peripheral frame 490 of the structural layer of the flexure tail 400, with an optional insulative flexure cover layer 416 being disposed over a portion of the flexure traces 418.

Now referring to FIGS. 3A-C, 4, and 6A-B, a thermode tool 620 may be brought into contact with a plurality of discontinuous islands (e.g. including discontinuous island 440) in the structural layer 410, to press the widened region 420 against the FPC bond pad 390 for a period. As shown in FIG. 6B, the ACF 610 may comprise an adhesive material 614 that includes a plurality of electrically conductive beads 612 of substantially similar diameter. In certain embodiments the ACF 610 may employ beads of non-spherical shape, such as cylindrical beads or needle shaped beads. In certain embodiments the adhesive material 614 may be deposited on to the FPC bond pad 390 prior to aligning the widened region 420 therewith. Alternatively, the adhesive material 614 may be deposited on a first side of the widened region 420 (e.g. facing the FPC bond pad 390) prior to bringing the thermode tool 620 into contact with an opposing second side of the discontinuous island 440 (facing the thermode tool 620).

As shown in FIGS. 6A-B, the force 630 that presses (via the thermode tool 620) the flexure bond pads against the FPC bond pads during the period of bonding, may arrange the plurality of electrically conductive beads 612 in a monolayer. Each of the plurality of electrically conductive beads 612 in the monolayer may be in electrical contact with both the widened region 420 and the corresponding FPC bond pad 390. The thermode tool 620 may also transfer heat through the discontinuous island 440 and the widened region 420 during the period of bonding, and raise the temperature of the adhesive material 614 during such period, for example to accelerate curing of the adhesive material 614.

In certain embodiments, the force 630 of the thermode tool 620 is sufficient to cause the electrically conductive beads 612 to be substantially elastically deformed in compression between the widened region 420 and the corresponding FPC bond pad 390 during the period of thermal curing of the adhesive material 614. After the thermode tool 620 is removed, the electrically conductive beads 612 cool (with the cured adhesive) from an elevated curing temperature. Such cooling causes the electrically conductive beads 612 to shrink relative to their expanded size during thermal curing of the adhesive material 614.

However, the force 630 is preferably chosen to be great enough that the post-curing shrinkage of the electrically conductive beads 612 cannot completely relieve the compressive deformation of the electrically conductive beads 612 that was experienced during curing. Hence, after curing of the adhesive material 614, and after removal of the thermode tool 620, the electrically conductive beads 612 may remain in compression (and somewhat compressively deformed) between the widened region 420 and the corresponding FPC bond pad 390.

Although residual compression of the electrically conductive beads 612 may correspond to some residual tension in the cured adhesive material 614, such residual compression of the electrically conductive beads 612 may be desirable to enhance and ensure reliable electrical conductivity of the ACF 610. For example, in the case where the electrically conductive beads 612 are spherical, the residual compression may cause small flat spots where the electrically conductive beads 612 contact the widened region 420 and the corresponding FPC bond pad 390. Such flat spots can provide finite contact areas rather than point contacts, which may desirably reduce the electrical resistance of the ACF 610.

To help facilitate higher volume manufacturing, the thermode tool 630 may include a flat surface that is substantially larger than any of the plurality of discontinuous islands in the flexure structural layer 410, for example, so that many widened regions of the flexure conductive layer 414 may be subjected to the applied pressure and heat transfer simultaneously. The localized flexure tail thickness increases at the location of the widened regions, that result from the discontinuous islands in the flexure tail terminal region 400 as shown and described previously with reference to FIG. 4, may advantageously allow a large flat thermode tool (e.g. thermode tool 620) to provide pressure and heat only to the widened region locations—without a need to first pattern or precisely align the thermode tool 620. This may advantageously simplify high volume manufacture. That is, in certain embodiments of the present invention, the local thickness variations of the flexure tail 400 due to the discontinuous islands, may act as a self-aligning pattern to augment and assist the thermode tool to selectively apply pressure and heat more to desired widened region locations of the flexure tail terminal region 400 than to undesired locations (e.g. locations away from the widened regions).

Figure 7A:
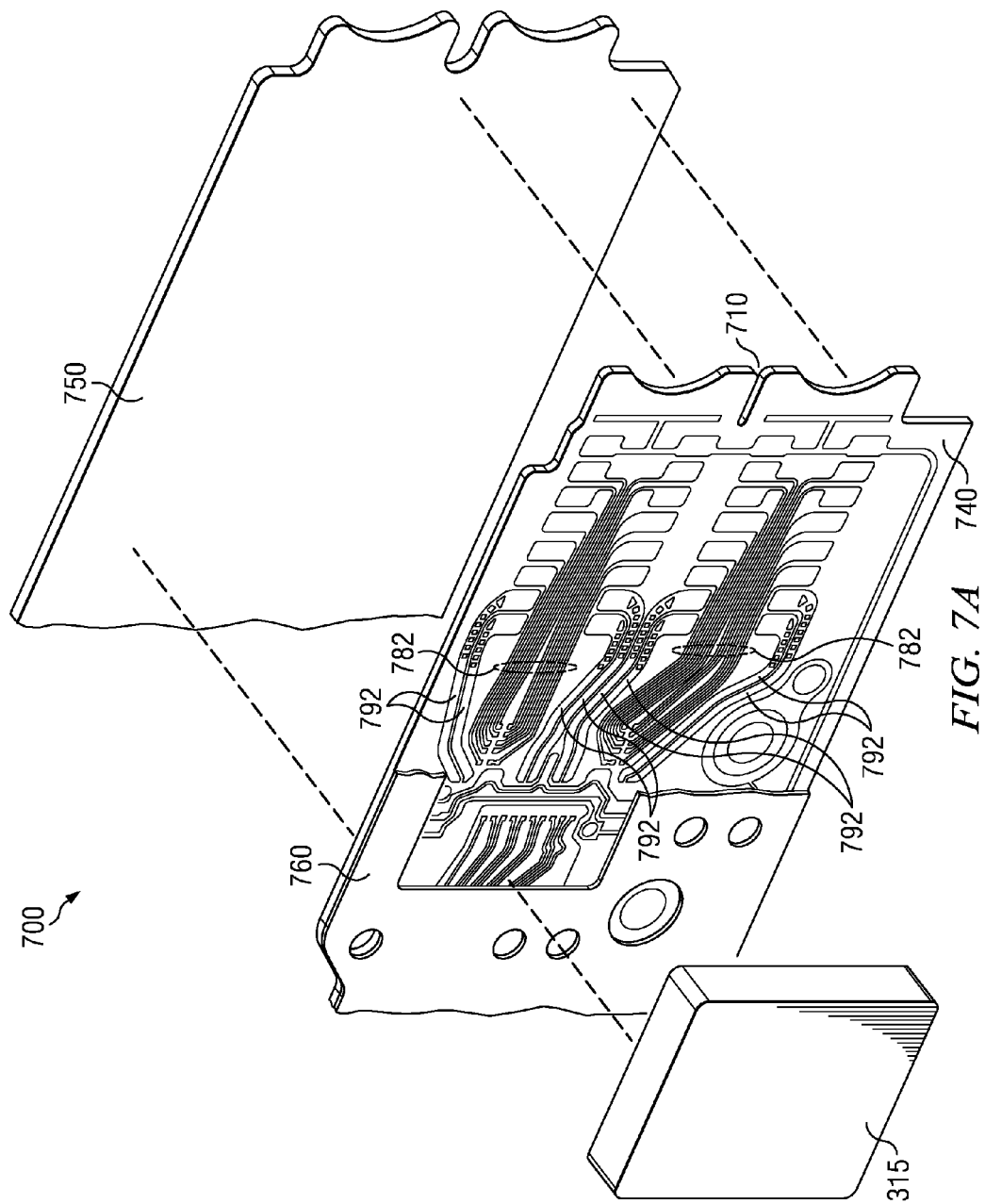
FIG. 7A is a perspective view of a portion of a flexible printed circuit (FPC) according to another embodiment of the present invention, shown with a FPC cover layer partially cut-away (and with a pre-amplifier chip and a FPC stiffener exploded away) to better depict underlying FPC conductive traces.
Figure 7B:
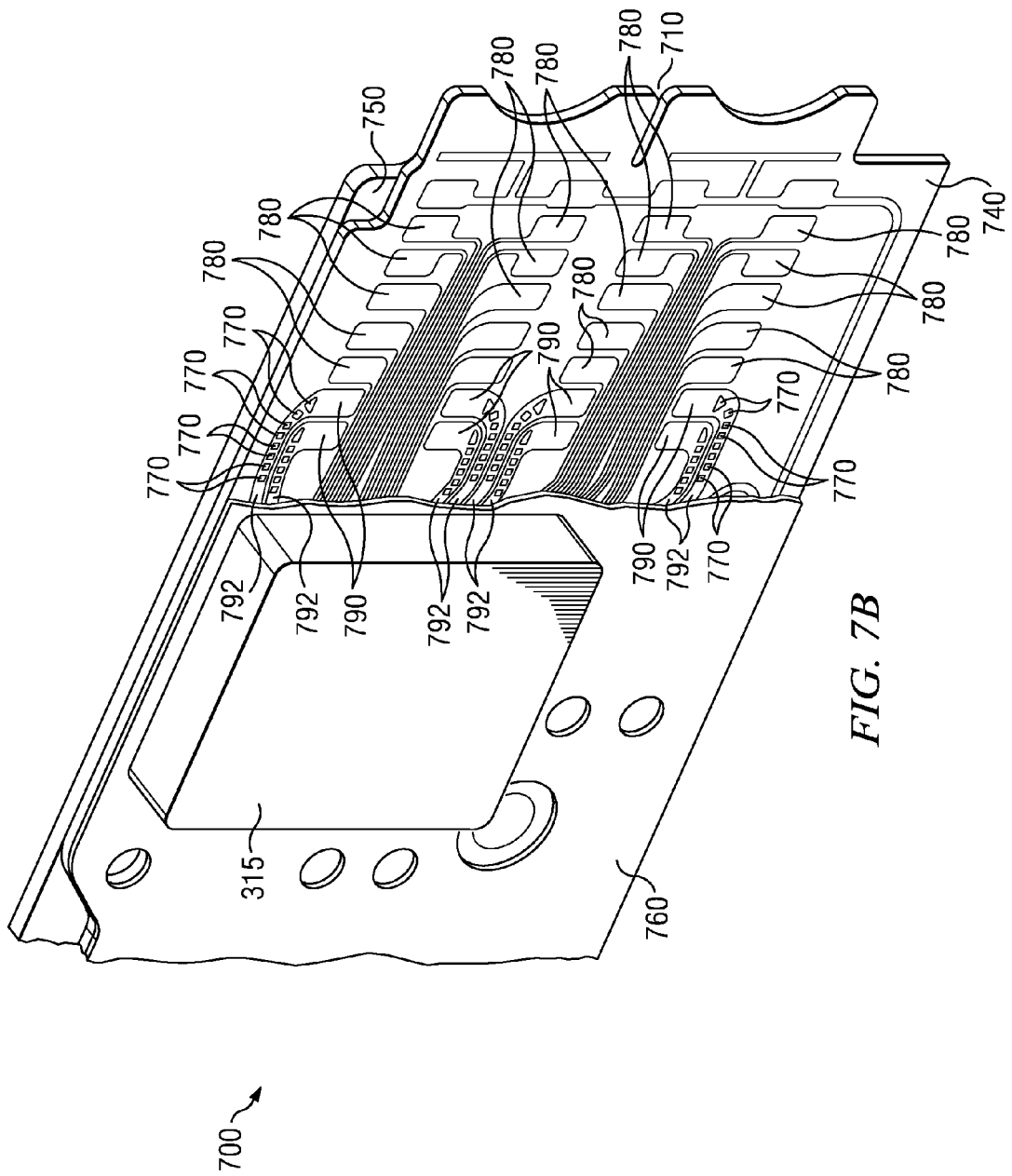
FIG. 7B is an assembled perspective view of the FPC portion of FIG. 7A, shown with the FPC cover layer partially cut-away to better depict underlying FPC conductive traces.

FIG. 7A is a perspective view of a portion of a flexible printed circuit (FPC) 700 according to another embodiment of the present invention, before flexure tail terminal regions (e.g. the flexure tail terminal region 278 shown in FIG. 2) are bonded thereto. The FPC 700 is shown in FIG. 7A with a FPC cover layer 760 partially cut-away, and with a pre-amplifier chip 315 and a FPC stiffener 750 exploded away. FIG. 7B is an assembled perspective view of the FPC 700, shown with the FPC cover layer 760 partially cut-away.

In the embodiment of FIGS. 7A and 7B, the FPC 700 includes electrically conductive FPC traces 782, 792, each having a distal portion that terminates at a respective one of a plurality of electrically conductive FPC bond pads 780, 790. The electrically conductive FPC traces 782, 792 may comprise copper for example, and the FPC bond pads 780, 790 may comprise copper with a gold coating, for example. The electrically conductive FPC bond pads 780, 790 are intended to be aligned with and connected to flexure bond pads of the terminal regions of HGA flexure tails (e.g. flexure tail terminal region 278 shown in FIG. 2). The electrically conductive FPC traces 782, 792 may connect to a pre-amplifier chip 315 (shown exploded from the FPC 700 in FIG. 7A). Intermediate regions of two of the HGA flexure tails (e.g. flexure tail intermediate region 276 shown in FIG. 2) may pass through the FPC slit 710 to help facilitate their support and alignment.

In the embodiment of FIGS. 7A-B, the FPC 700 includes the optional insulative FPC cover layer 760 over the FPC traces 782, 792 with windows exposing the regions where the flexure tail terminal regions and the pre-amplifier chip 315 are bonded thereto. In FIGS. 7A and 7B, the FPC 700 is shown with the FPC cover layer 760 partially cut-away to better depict underlying FPC conductive traces 782, 792.

In the embodiment of FIGS. 7A and 7B, the electrically conductive FPC traces 792 are wider than the electrically conductive FPC traces 782, for example so that the FPC traces 792 can match a lower desired electrical impedance. For example, in certain embodiments, those FPC bond pads that connect through to an inductive write element of a read/write head may be wider than those that connect through to a magnetoresistive read element (e.g. a tunneling magnetoresistive read element) of the read/write head. For example, a desired writer transmission line impedance might be approximately 50Ω with a write frequency of approximately 2.7 GHz, though write frequencies may trend higher in the future and desired impedances may trend lower in the future, for example to reduce power consumption.

During bonding of the FPC bond pads 780, 790 to flexure bond pads of the flexure tail terminal regions, those FPC bond pads 790 associated with the wider FPC traces 792 may conduct away more heat than the FPC bond pads 780 associated with narrower FPC traces 782. Therefore, to maintain more uniform temperature among the various bond pads during bonding, it may be advantageous to reduce the rate of heat transfer from the FPC bond pads 790 relative to that from the FPC bond pads 780.

It may also be advantageous to enhance the speed and ease of the manufacturing process by simultaneously bonding all of the FPC bond pads 780, 790 with a relatively large and simple tool that cannot control the temperature applied to one bond pad independently from the temperature applied to another bond pad. Hence, it may be desirable to vary the rate of heat conduction away from specific FPC bond pads (relative to other FPC bond pads) via design of certain structural aspects of the FPC.

For example, in the embodiment of FIGS. 7A and 7B, the distal portions of the wider FPC traces 792 include openings 770 therethrough (in this embodiment, eight openings 770 per FPC trace 792, and in general preferably 1 to 20 openings through the distal portion of each FPC trace 792). The openings 770 in the distal portion of each of the wider FPC traces 792 may serve to reduce the rate of heat conduction through the wider FPC traces 792 away from the FPC bond pads 790, so that such rate of heat conduction may be less different from the rate of heat conduction through the narrower FPC traces 782 away from the FPC bond pads 780. Otherwise, the rate of heat conduction through the narrower FPC traces 782 away from the FPC bond pads 780 may be substantially lower than that through the wider FPC traces 792 away from the FPC bond pads 790. Hence, the openings 770 in the distal portion of each of the wider FPC traces 792 may advantageously improve the temperature uniformity among the FPC bond pads 780 and 790, temporarily during the bonding process (i.e. bonding flexure tails to the FPC during head stack assembly).

In the embodiment of FIGS. 7A and 7B, each of the openings 770 preferably spans at least 30% of the width of the corresponding FPC trace 792 in its distal portion. For example, the width of the distal portion of the FPC trace 792 may be in the range 100 microns to 300 microns, with each of the openings 770 spanning at least 30 microns, but no more than 260 microns of the width of the distal portion of the FPC trace 792. In certain embodiments, such inequalities may help to advantageously improve the temperature uniformity among the FPC bond pads 780 and 790, temporarily during the bonding process (i.e. bonding flexure tails to the FPC during head stack assembly).

In certain embodiments, the closest of the openings 770 to the FPC bond pad 790 is the most important of the openings 770 from a functional perspective. Hence, in certain embodiments, there need be only one opening 770 in the distal portion of each of the FPC traces 792, rather than eight as shown in FIGS. 7A and 7B. In certain embodiments, such single opening 770 may be disposed immediately adjacent the FPC bond pad 790. In certain embodiments, such single opening 770 may be disposed at approximately the same location as the closest of the openings 770 to the FPC bond pad 790 shown in FIGS. 7A and 7B.

In certain embodiments, the closest of the openings 770 to the FPC bond pad 790 is spaced from the FPC bond pad 790 by a distance measured along the FPC trace 792 that preferably does not exceed five times the width of the distal portion of the FPC trace 792. For example, the closest of the openings 770 to the FPC bond pad 790 may be spaced from the FPC bond pad 790 by a distance measured along the FPC trace 792 that is preferably less than 1 mm. In certain embodiments, such inequalities may help to advantageously improve the temperature uniformity among the FPC bond pads 780 and 790, temporarily during the bonding process (i.e. bonding flexure tails to the FPC during head stack assembly).

In FIG. 7A, the FPC stiffener 750 may be metallic, for example, it may comprise aluminum. The FPC stiffener 750 may be disposed in contact with the actuator body after assembly (e.g. in contact with the actuator body 232 that is shown in FIG. 2). Now referring again to FIGS. 7A-B, the FPC 700 may include a FPC dielectric layer 740 that is disposed between the FPC stiffener 750 and the FPC traces 782, 792, for example to prevent the FPC stiffener 750 from creating an electrical short between the FPC traces 782, 792 if the FPC stiffener 750 comprises a conductive metal. Note that the FPC dielectric layer 740 is not the same layer as the insulative FPC cover layer 760, at least because the insulative FPC cover layer 760 is disposed over the FPC traces 782, 792 rather than between the FPC stiffener 750 and the FPC traces 782, 792.

In the foregoing specification, the invention is described with reference to specific exemplary embodiments, but those skilled in the art will recognize that the invention is not limited to those. It is contemplated that various features and aspects of the invention may be used individually or jointly and possibly in a different environment or application. The specification and drawings are, accordingly, to be regarded as illustrative and exemplary rather than restrictive. For example, the word "preferably," and the phrase "preferably but not necessarily," are used synonymously herein to consistently include the meaning of "not necessarily" or optionally. "Comprising," "including," and "having," are intended to be open-ended terms.

What is claimed is:

1. A disk drive comprising:
    a disk drive base;
    a disk rotably mounted to the disk drive base;
    a head stack assembly (HSA) rotably mounted to the disk drive base, the HSA including an actuator body, at least one actuator arm extending from the actuator body, and a flexible printed circuit (FPC), the FPC including
        a first plurality of FPC traces, each being electrically conductive and having a distal portion that terminates at a respective one of a first plurality of FPC bond pads that are electrically conductive;
        a second plurality of FPC traces, each being electrically conductive and terminating at a respective one of a second plurality of FPC bond pads that are electrically conductive, wherein a first width of at least one of the first plurality of FPC traces is greater than a second width of at least one of the second plurality of FPC traces;
        wherein the distal portion of the at least one of the first plurality FPC traces includes a first opening therethrough; and
    at least one head gimbal assembly comprising
        a read head; and
        a suspension assembly attached to the at least one actuator arm, the suspension assembly comprising
            a load beam, and
            a laminate flexure that includes a plurality of electrically conductive flexure traces that each terminate at a respective one of a plurality of electrically conductive flexure bond pads, the plurality of electrically conductive flexure bond pads being bonded to the first and second pluralities of FPC bond pads.

2. The disk drive of claim 1 wherein the first opening spans at least 30% of the first width.

3. The disk drive of claim 1 wherein the first width is in the range 100 microns to 300 microns, and the first opening spans at least 30 microns of the first width, but no more than 260 microns of the first width.

4. The disk drive of claim 1 wherein the plurality of electrically conductive flexure bond pads is bonded to the first and second pluralities of FPC bond pads by an anisotropic conductive film.

5. The disk drive of claim 1 wherein the distal portion of the at least one of the first plurality FPC traces includes a plurality of openings therethrough that includes the first opening.

6. The disk drive of claim 1 wherein the first opening is disposed immediately adjacent the respective one of the first plurality of FPC bond pads.

7. The disk drive of claim 1 wherein the first opening is disposed a first distance from the respective one of the first plurality of FPC bond pads, the first distance being measured along the at least one of the first plurality FPC traces, the first distance not exceeding five times the first width.

8. The disk drive of claim 7 wherein the first distance is less than 1 mm.

9. The disk drive of claim 1 wherein the FPC further comprises a metallic stiffener and a FPC dielectric layer between the metallic stiffener and the first and second pluralities of FPC traces, the metallic stiffener including a first window therethrough, the first window overlying a first portion of the first plurality of FPC traces but not overlying any portion of the second plurality of FPC traces.

10. The disk drive of claim 9 wherein the metallic stiffener further includes a second window therethrough, the second window overlying a second portion of the first plurality of FPC traces but not overlying any portion of the second plurality of FPC traces.

11. The disk drive of claim 9 wherein the actuator body and the metallic stiffener each comprises aluminum, and are in contact with each other.

12. The disk drive of claim 9 wherein the FPC further comprises an insulative cover layer over the first and second pluralities of FPC traces, the insulative cover layer being not disposed between the metallic stiffener and the first or second pluralities of FPC traces.

13. The disk drive of claim 1 wherein the plurality of electrically conductive flexure traces, and the first and second pluralities of FPC traces, each comprises copper.

14. The disk drive of claim 1 wherein the plurality of electrically conductive flexure bond pads, and the first and second pluralities of FPC bond pads, each comprises copper with a gold coating.

15. A head stack assembly (HSA) for a disk drive, the HSA comprising:
   an actuator body, at least one actuator arm extending from the actuator body, and a flexible printed circuit (FPC), the FPC including
   a first plurality of FPC traces, each being electrically conductive and having a distal portion that terminates at a respective one of a first plurality of FPC bond pads that are electrically conductive;
   a second plurality of FPC traces, each being electrically conductive and terminating at a respective one of a second plurality of FPC bond pads that are electrically conductive, wherein a first width of at least one of the first plurality of FPC traces is greater than a second width of at least one of the second plurality of FPC traces;
   wherein the distal portion of the at least one of the first plurality FPC traces includes a first opening therethrough; and
   at least one head gimbal assembly comprising
   a read head; and
   a suspension assembly attached to the at least one actuator arm, the suspension assembly comprising
   a load beam, and
   a laminate flexure that includes a plurality of electrically conductive flexure traces that each terminate at a respective one of a plurality of electrically conductive flexure bond pads, the plurality of electrically conductive flexure bond pads being bonded to the first and second pluralities of FPC bond pads.

16. The HSA of claim 15 wherein the first opening spans at least 30% of the first width.

17. The HSA of claim 15 wherein the first width is in the range 100 microns to 300 microns, and the first opening spans at least 30 microns of the first width, but no more than 260 microns of the first width.

18. The HSA of claim 15 wherein the plurality of electrically conductive flexure bond pads is bonded to the first and second pluralities of FPC bond pads by an anisotropic conductive film.

19. The HSA of claim 15 wherein the distal portion of the at least one of the first plurality FPC traces includes a plurality of openings therethrough that includes the first opening.

20. The HSA of claim 15 wherein the first opening is disposed immediately adjacent the respective one of the first plurality of FPC bond pads.

21. The HSA of claim 15 wherein the first opening is disposed a first distance from the respective one of the first plurality of FPC bond pads, the first distance being measured along the at least one of the first plurality FPC traces, the first distance not exceeding five times the first width.

22. The HSA of claim 21 wherein the first distance is less than 1 mm.

23. The HSA of claim 15 wherein the FPC further comprises a metallic stiffener and a FPC dielectric layer between the metallic stiffener and the first and second pluralities of FPC traces, the metallic stiffener including a first window therethrough, the first window overlying a first portion of the first plurality of FPC traces but not overlying any portion of the second plurality of FPC traces.

24. The HSA of claim 23 wherein the FPC further comprises an insulative cover layer over the first and second pluralities of FPC traces, the insulative cover layer being not disposed between the metallic stiffener and the first or second pluralities of FPC traces.

25. A disk drive comprising:
   a disk drive base;
   a disk rotably mounted to the disk drive base;
   a head stack assembly (HSA) rotably mounted to the disk drive base, the HSA including an actuator body, at least one actuator arm extending from the actuator body, and a flexible printed circuit (FPC), the FPC including
   a first plurality of FPC traces, each being electrically conductive and having a distal portion that terminates at a respective one of a first plurality of FPC bond pads that are electrically conductive;
   a second plurality of FPC traces, each being electrically conductive and terminating at a respective one of a second plurality of FPC bond pads that are electrically conductive, wherein a first width of at least one of the first plurality of FPC traces is greater than a second width of at least one of the second plurality of FPC traces;
   a metallic stiffener including a first window therethrough, the first window overlying a first portion of the first plurality of FPC traces but not overlying any portion of the second plurality of FPC traces;
   a FPC dielectric layer between the metallic stiffener and the first and second pluralities of FPC traces; and
   at least one head gimbal assembly comprising
   a read head; and
   a suspension assembly attached to the at least one actuator arm, the suspension assembly comprising
   a load beam, and
   a laminate flexure that includes a plurality of electrically conductive flexure traces that each terminate at a respective one of a plurality of electrically conductive flexure bond pads, the plurality of electrically conductive flexure bond pads being bonded to the first and second pluralities of FPC bond pads.

26. The disk drive of claim 25 wherein the plurality of electrically conductive flexure bond pads is bonded to the first and second pluralities of FPC bond pads by an anisotropic conductive film.

27. The disk drive of claim 25 wherein the metallic stiffener further includes a second window therethrough, the second window overlying a second portion of the first plurality of FPC traces but not overlying any portion of the second plurality of FPC traces.

28. The disk drive of claim 25 wherein the actuator body and the metallic stiffener each comprises aluminum, and are in contact with each other.

29. The disk drive of claim 25 wherein the FPC further comprises an insulative cover layer over the first and second pluralities of FPC traces, the insulative cover layer being not disposed between the metallic stiffener and the first or second pluralities of FPC traces.

* * * * *